United States Patent [19]

Sugimoto

[11] Patent Number: 4,870,923
[45] Date of Patent: Oct. 3, 1989

[54] APPARATUS FOR TREATING THE SURFACES OF WAFERS

[75] Inventor: Kenji Sugimoto, Kyoto, Japan

[73] Assignee: Dainippon Screen Mfg. Co., Ltd., Japan

[21] Appl. No.: 211,773

[22] Filed: Jun. 27, 1988

[30] Foreign Application Priority Data

Jun. 26, 1987 [JP] Japan .............................. 62-98829[U]

[51] Int. Cl.$^4$ .............................................. C23C 16/00
[52] U.S. Cl. ...................................... 118/715; 118/725
[58] Field of Search ........................ 118/723, 725, 715

[56] References Cited

U.S. PATENT DOCUMENTS

| | | | |
|---|---|---|---|
| 4,340,462 | 6/1982 | Koch | 156/345 |
| 4,693,211 | 9/1987 | Ogami | 118/725 |
| 4,695,700 | 9/1987 | Provence | 156/345 |
| 4,767,641 | 8/1988 | Kieser | 118/723 |

Primary Examiner—Richard Bueker
Attorney, Agent, or Firm—Ostrolenk, Faber, Gerb & Soffen

[57] ABSTRACT

An apparatus for treating the surface of wafers with a vaporous agent. The apparatus includes an arrangement in which, prior to being discharged, excess vapor stays for a while outside a treating chamber so as to keep the treating vapor and the discharging excess vapor at the same vaporous level. Thus, treating vapor evenly contacts the entire surface of a wafer.

6 Claims, 3 Drawing Sheets

APPARATUS FOR TREATING THE SURFACES OF WAFERS

BACKGROUND OF THE INVENTION

1. Field of the Invention

The present invention relates to an apparatus for treating the surfaces of wafers of semiconductor or glass with a vaporous agent so as to improve their surface properties. For example, the surface of a wafer is treated to enhance its ability to a adhere to photoresist.

2. Description of the Prior Art

In order to treat the surfaces of a wafer with a vaporous agent, hereinafter referred to merely as "vapor", the important thing is to cover the entire surface with the vapor evenly. The applicant has devised an apparatus for evenly spreading a vapor over the surface of a wafer, which is disclosed in Japanese Utility Model Application Kokai No. 61-119341 (U.S. Pat. No. 4,693,211).

To explain the background of the present invention this previous apparatus will be described with reference to FIG. 3.

The apparatus includes a heating plate 2 on which a wafer 1 is placed. A cover 10 covers the wafer 1 on the heating plate 2 to form a treating chamber 11 therebetween. A tube 14 is provided for introducing a vapor into the treating chamber 11. A discharge chamber 8 is provided around the heating plate 2. The discharge chamber includes slits 8a. Excess vapor is led into the discharge chamber 8 throught the slits 8a. The cover 10 is moved up and down by a power driving unit(not shown). When the cover 10 is placed over the heating plate 2, a gap 9 is formed therebetween and the excess vapor is allowed to pass therethrough.

The wafer 1 is conveyed to and from the heating plate 2 by means of a conveyor belt 16. When the wafer 1 is to be placed on the heating plate 2, the conveyor belt sinks into a recess 17, leaving the wafer 1 on the heating plate 2. The heating plate 2 is provided with bores 3 through which the wafer 1 on the plate 2 is sucked by a vacuum member (not shown). The treating chamber 11 is divided into an upper section 11a and a lower section by a partition 12, the partition is provided with pores 13 adapted to evenly distribute the vapor in the chamber 11. The reference numeral 15 denotes a heat shield.

The vapor is introduced into the treating chamber 11 through the tube 14. Within the treating chamber 11, the vapor contacts the surface of the wafer 1. Excess vapor escapes from the treating chamber 11 through the gap 9 and is directed into the discharge chamber 8. If the vapor flow within the treating chamber 11 is disturbed, the vapor will not evenly contact the surface of the wafer. The apparatus of FIG. 3 is devised so that the slits 8a are located at a distance from the wafer 1 so as to avoid the influence of suction acting in the slits, and to minimize turbulence of the treating vapor.

However, under within the apparatus of FIG. 3, disturbance of excess vapor is likely to occur at the gap 9 in response to any change occurring in the flow and the pressure of the discharging excess vapor when the excess vapor passes through the slits 8a. This disturbance is unavoidable because of the small cross-section of the gap 9. The disturbance outside the treating chamber 11 prevents the vapor therein from contacting the surface of the wafer evenly. To make up for the uneven contact of vapor it becomes necessary to prolong the treating period, or to increase the amount of the treating vapor.

OBJECTS AND SUMMARY OF THE INVENTION

The present invention is directed toward an improved apparatus for treating the surface of a wafer with a vaporous agent, and has for its object to provide an apparatus which keeps the treating vapor and the discharging excess vapor at the same vaporous level, thereby ensuring that the treating vapor evenly contacts the entire surface of the wafer.

Other objects and advantages of the present invention will become more apparent from the following detailed description, when taken in conjunction with the accompanying drawings which show, for the purpose of illustration only, preferred embodiment in accordance with the present invention.

According to the present invention there is provided an invention is basically structurally identical to the apparatus of FIG. 3. The apparatus of the present invention includes a heating plate 2 on which a wafer 1 is placed. A cover 10 covers the wafer 1 on the heating plate 2 to form a treating chamber 11 therebetween. A tube 14 is provided for introducing a treating vapor into the treating chamber 11, a discharge chamber 8 is provided around the heating plate 2, and the discharge chamber includes slits 8a through which excess vapor is directed. When the cover 10 is placed over the heating plate 2, a gap 9 is formed therebetween. Excess vapor is allowed to pass through the gap 9.

In the illustrated embodiment, the wafer 1 is conveyed to and from the heating plate 2 by means of a pair of arms 6a, 6b. When the wafer 1 is conveyed by the left-hand arm 6a over the heating plate 2, the wafer 1 is received by rods 7a level, thereby enabling the treating vapor to keep contact with the entire surface of the wafer.

DETAILED DESCRIPTION OF THE PREFERRED EMBODIMENTS

Figure 1:
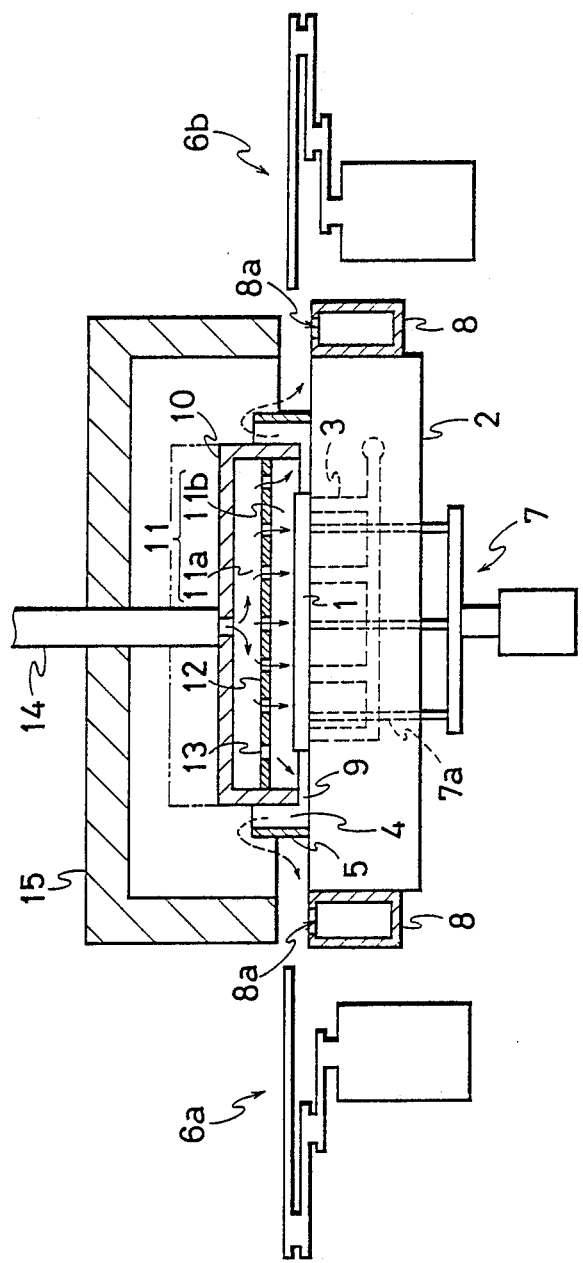
FIG. 1 is a vertical cross-section through an apparatus according to the present invention.
Figure 3:
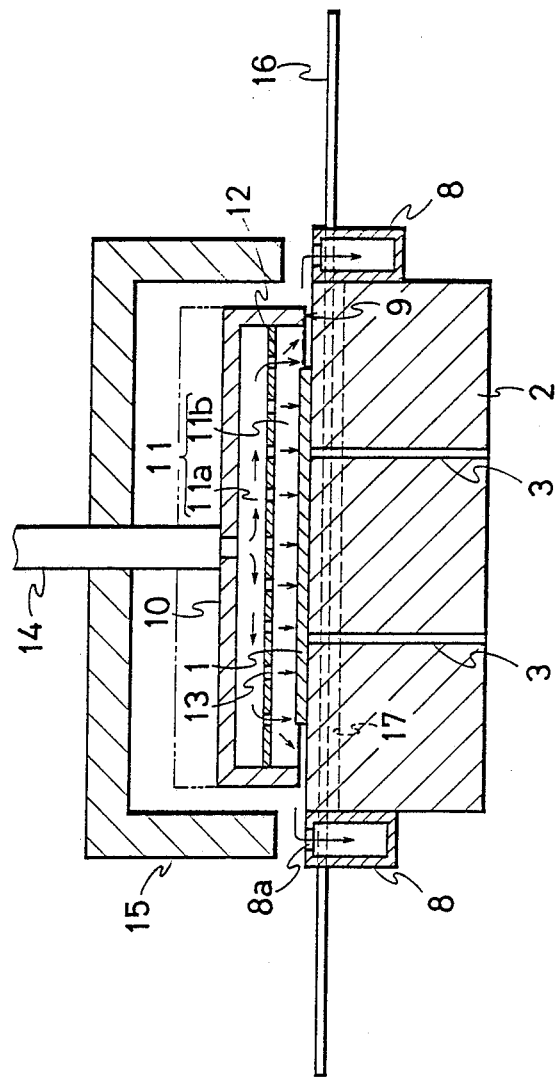
FIG. 3 is a vertical cross-section through a prior art apparatus.

Referring to FIG. 1, the apparatus of the present invention is basically identical in structure to the apparatus of FIG. 3 described above, that is, it includes a heating plate 2 on which a wafer 1 is placed, a cover 10 covering the wafer 1 on the heating plate 2, thereby forming a treating chamber 11 therebetween, a tube 14 for introducing a treating vapor into the treating chamber 11, a discharge chamber 8 provided around the heating plate 2, the discharge chamber including slits 8a through which an excess vapor is led into the discharge chamber 8. When the cover 10 is placed over the heating plate 2, a gap 9 is formed therebetween so that the excess vapor is allowed to pass through.

In the illustrated embodiment the wafer 1 is conveyed to and from the heating plate 2 by means of a pair of arms 6a, 6b and when the wafer 1 is conveyed by the left-hand arm 6a over the heating plate 2, it is received by rods 7a of a lift 7 which ascends synchronously with the movement of the arm 6a. The wafer 1 is placed on the heating plate 2 as the rods 7a descend.

The heating plate 2 is provided with bores 3 through which the wafer 1 on the plate 2 is sucked by a vacuum member (not shown). In addition to the vacuum member, a heating device and a thermometer are provided in the heating plate 2 though they are not shown. The vacuum member, the heating device and the thermometer constantly hold the wafer 1 at a desired temperature.

The treating chamber 11 is divided into an upper section 11a and a lower section 11b by a partition 12. The partition 12 is provided with pores 13 through which the vapor spreads evenly as the vapor flows through the chamber 11. Reference numeral 15 denotes a heat shield.

The cover 10 is moved up and down by a power driving member (not shown). When the wafer 1 is to be placed on the heating plate 2, the cover 10 is raised up to the position shown in phantom lines in FIG. 1. After the wafer 1 is secured on the heating plate 2, the cover 10 is lowered to the position shown in solid lines.

Figure 2:
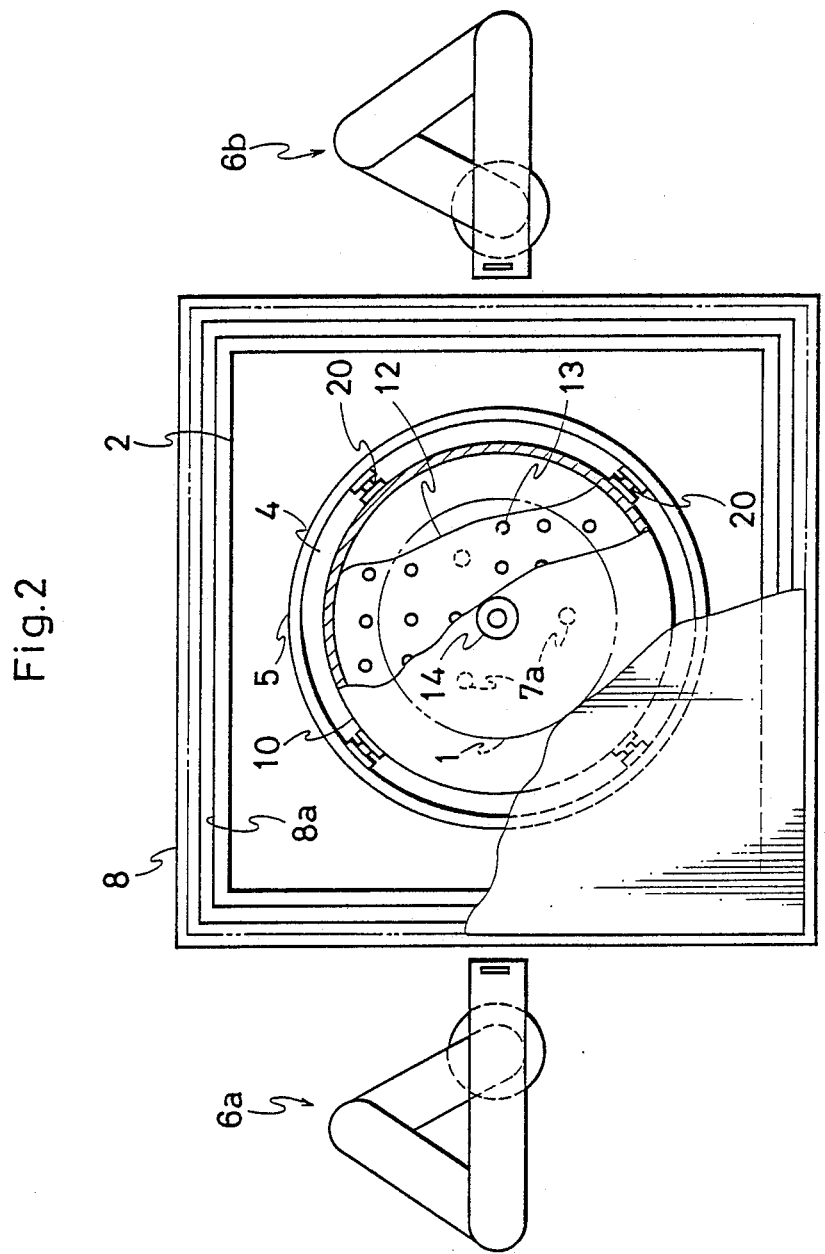
FIG. 2 is a partly broken plan view of the apparatus of FIG. 1.

The apparatus of the present invention includes a ring-shaped outer wall 5. The outer wall 5 is secured to the cover 10 by means of joints 20 (FIG. 2). As shown in FIG. 1, when the cover 10 is fully lowered to cover the wafer 1, the lower rim of the outer wall 5 comes into abutment with the heating plate 2, thereby producing a gap 9 (normally about 0.5 mm wide). The upper rim of the outer wall 5 is higher than the top surface of the wafer 1.

In operation , the wafer 1 is conveyed by the left-hand arm 6a to a point over the heating plate 2, and transferred therefrom onto the rods 7a of the lift 7 which ascends synchronously with the movement of the arm 6a. Then the rods 7a are, leaving the wafer 1 on the heating plate 2.

The vacuum member (not shown ) is driven to hold the wafer 1 on the heating plate 2 by suction provided through the bores 3. The wafer 1 is heated to a desired temperature. Then the cover 10 is lowered until the lower rim of the outer wall 5 comes into abutment with the top surface of the heating plate 2.

A treating vapor is introduced into the treating chamber 11 through the tube 14 The vapor contacts the surface of the wafer 1 within the chamber 11. In this way the surface of the wafer 1 is treated. Excess vapor flows through the gap 9 but collides with the outer wall 5. After wandering about in a space 4 defined by the outer wall 5 and the cover 10, the excess vapor flows over the outer wall 5. Finally, the excess vapor is sucked into the slits 8a of the discharge chamber 8.

When treatment is finished, the cover 10 is raised, and the treated wafer 1 is released from the suction. The rods 7a are raised to enable the wafer 1 to transfer onto the right-hand arm 6b, which is moved to the right. The next wafer 1 is conveyed by the left-hand arm 6a in the same manner as described above, and the procedure is repeated.

The treating agent can be chlorosilanes,hexamethyledisilazanes or any other substance whose vapor can enhance the ability of the surface of the wafer to adhere to a photoresist at a given temperature.

In the illustrated embodiment the outer wall 5 is fixed to the cover 10 by means of joints, but the wall can be arranged with respect to the apparatus in other ways. The illustrated cover 10 is dome-shaped but it can be polygonal. The heating plate 2 can be disc-shaped depending upon the shape of the wafer 1. The discharge chamber 8 can be ring-shaped so as to surround the heating plate 2.

The belt conveyor shown in FIG. 3 can be substitute for the arms 6a, 6b.

The apparatus according to the invention need not include the heating plate 2. Instead, of the heating plate, a cooling plate may be employed.

Furthermore, although the heating plate 2 has been described as including bores 3 for sucking the wafer 1 the bores 3 may be omitted.

As is evident from the foregoing, the main feature of the present invention resides in the provision of the outer wall 5. The present invention provides the following advantages:

(1) The surface of a wafer can be treated without any part of it remaining untreated.

(2) The consumption of a treating agent is minimized.

(3) No special skill or attention is needed in to determine the size of the gap 9 between the cover 10 and the heating plate 2.

What is claimed is:

1. An apparatus for treating a wafer with treating vapor, said apparatus comprising:
   a plate member adapted to receive a wafer;
   a cover member for covering the wafer and for forming a treating chamber between said cover member and said plate member;
   means for placing said cover member over said plate member with a gap interposed therebetween so as to allow excess vapor to escape from said treating chamber;
   means for introducing treating vapor into said treating chamber;
   a discharge chamber comprising slits and means for introducing said excess vapor into said discharge chamber through said slits; and
   an outer wall provided about said cover member, said outer wall and said cover member defining a space therebetween, said outer wall having a lower rim and an upper rim, said lower rim contacting said plate member and said upper rim being higher than said gap such that the flow of vapor from said treating chamber to said discharge chamber follows a tortious path.

2. An apparatus as recited in claim 1, further comprising a porous partition located in said treating chamber so as to divide said treating chamber into an upper section and a lower section, said partition being adapted to spread the treating vapor evenly over the surface of the wafer.

3. An apparatus as recited in claim 1, wherein said outer wall is fixed to said cover member by means of joints.

4. An apparatus for treating a wafer with treating vapor, said apparatus comprising:
   a chamber;
   means for supporting a wafer within said chamber;
   means for moving the wafer to said supporting means;
   means for moving the wafer from said supporting means;
   means for flowing treating vapor through said chamber; and
   means for discharging excess vapor from said chamber, said discharging means including a movable wall, said wall being outside of said chamber, and said discharging means being adapted to minimize turbulence of the vapor flow through said chamber, whereby said apparatus can evenly cover the entire surface of the wafer with the treating vapor.

5. An apparatus for treating a wafer with treating vapor, said apparatus comprising:
a chamber;
means for supporting a wafer within said chamber;
means for flowing treating vapor through said chamber; and
means for discharging excess vapor from said chamber, said discharging means including a tortuous path, said tortuous path being adapted to minimize disturbances of the vapor flow through said chamber, whereby said apparatus can evenly cover the entire surface of the wafer with the treating vapor.

6. The apparatus of claim 5, said chamber and said supporting means defining a gap, said discharging means including said gap, said tortuous path being formed by a wall, said wall being located outside of said chamber, said wall having an upper rim which is higher than said gap.

* * * * *